(12) United States Patent
Toulmin et al.

(10) Patent No.: US 6,980,119 B2
(45) Date of Patent: Dec. 27, 2005

(54) SOLID-STATE WARNING LIGHT WITH ENVIRONMENTAL CONTROL

(75) Inventors: John W. Toulmin, Ridgeway (CA); Francis Balogh, Niagara Falls (CA)

(73) Assignee: SWS Star Warning Systems Inc., (CA)

( * ) Notice: Subject to any disclaimer, the term of this patent is extended or adjusted under 35 U.S.C. 154(b) by 59 days.

(21) Appl. No.: 10/607,021

(22) Filed: Jun. 26, 2003

(65) Prior Publication Data

US 2004/0041702 A1    Mar. 4, 2004

(51) Int. Cl.$^7$ .............................. G08B 5/22; G09F 9/33
(52) U.S. Cl. ............................. 340/815.45; 340/691.1; 362/800
(58) Field of Search ................................ 340/509, 517, 340/321, 525, 691.6, 691.3, 691.1, 85, 45, 340/908.1; 362/800

(56) References Cited

U.S. PATENT DOCUMENTS

| | | | |
|---|---|---|---|
| 3,757,511 A * | 9/1973 | Burgess et al. ................ 368/83 |
| 3,887,836 A | 6/1975 | Leete .......................... 315/207 |
| 4,181,915 A * | 1/1980 | Lagoni ........................ 348/570 |
| 4,295,226 A | 10/1981 | Dombrowski ............... 455/618 |
| 4,329,625 A * | 5/1982 | Nishizawa et al. .......... 315/158 |
| 4,388,558 A * | 6/1983 | Mizuno et al. ............... 315/77 |
| 4,571,506 A | 2/1986 | Lisco .......................... 307/311 |
| 4,707,692 A | 11/1987 | Higgins et al. ............. 340/805 |
| 4,723,312 A | 2/1988 | Yamashita et al. .......... 455/613 |
| 4,818,896 A | 4/1989 | Cavanna ..................... 307/362 |
| 4,866,430 A | 9/1989 | Chek .......................... 340/782 |
| 5,559,402 A | 9/1996 | Corrigan, III ............ 315/169.3 |
| 5,636,057 A * | 6/1997 | Dick et al. ................... 359/625 |
| 5,642,933 A | 7/1997 | Hitora ........................ 362/243 |
| 5,739,639 A | 4/1998 | Johnson ....................... 315/86 |
| 5,806,965 A | 9/1998 | Deese ......................... 362/249 |
| 6,049,175 A | 4/2000 | Forsberg ...................... 315/200 |
| 6,183,100 B1 | 2/2001 | Suckow et al. ................ 362/35 |
| 6,236,331 B1 * | 5/2001 | Dussureault ........... 340/815.45 |
| 6,263,280 B1 * | 7/2001 | Stingone, Jr. ............... 701/213 |
| 6,305,818 B1 * | 10/2001 | Lebens et al. .............. 362/184 |
| 6,320,330 B1 | 11/2001 | Haavisto et al. ............ 315/291 |
| 6,359,392 B1 | 3/2002 | He .............................. 315/291 |
| 6,366,028 B1 | 4/2002 | Wener et al. ............. 315/241 P |
| 6,461,008 B1 | 10/2002 | Pederson ...................... 362/35 |
| 6,525,668 B1 * | 2/2003 | Petrick ................... 340/815.45 |
| 6,717,559 B2 * | 4/2004 | Weindorf ..................... 345/82 |

OTHER PUBLICATIONS

"Designing A High-Frequency, Higher-Power Buck/Boost Converter for Multi-Cell Input Configurations Uing Si9168" Nitin Kalje, Vishay Siliconix, Feb. 2000, pp. 1-10.

(Continued)

*Primary Examiner*—Daniel Wu
*Assistant Examiner*—Travis Hunnings
(74) *Attorney, Agent, or Firm*—Hayes Soloway P.C.

(57) ABSTRACT

The present invention relates generally to warning lights, and more specifically, to solid-state (LED) warning light whose operation is modulated in response to environmental conditions, generally under the supervision of a microprocessor or dedicated control circuit. LEDs are used in warning lights, but not in an effective way. Typically, the LED driving circuits are electrically inefficient and in some cases, there is an attempt to minimize the power that is supplied to the LEDs. The invention employs environmental sensors which allow the operation of the LEDs to be optimized; for example: LED intensity can be increased in response to poor ambient visibility, duty cycle can be decreased in response to a lack of power, and the LEDs can be de-rated in response to high temperature conditions. Many other advantages of the invention are described, including the use of light control film, buck boost and buck down driver circuits, external communication circuits and microprocessor control.

23 Claims, 16 Drawing Sheets

OTHER PUBLICATIONS

"It's a Buck; It's a Boost, No! It's a Switcher!" Sanjaya Maniktala, National Semiconductor Corp., Planet Analog, Apr. 2, 2003, pp. 1-8.

"3M Light Control Film" Edmund Industrial Optics article.

"LexaLite Lex-Efx Light Control Film" LexaLite International article.

* cited by examiner

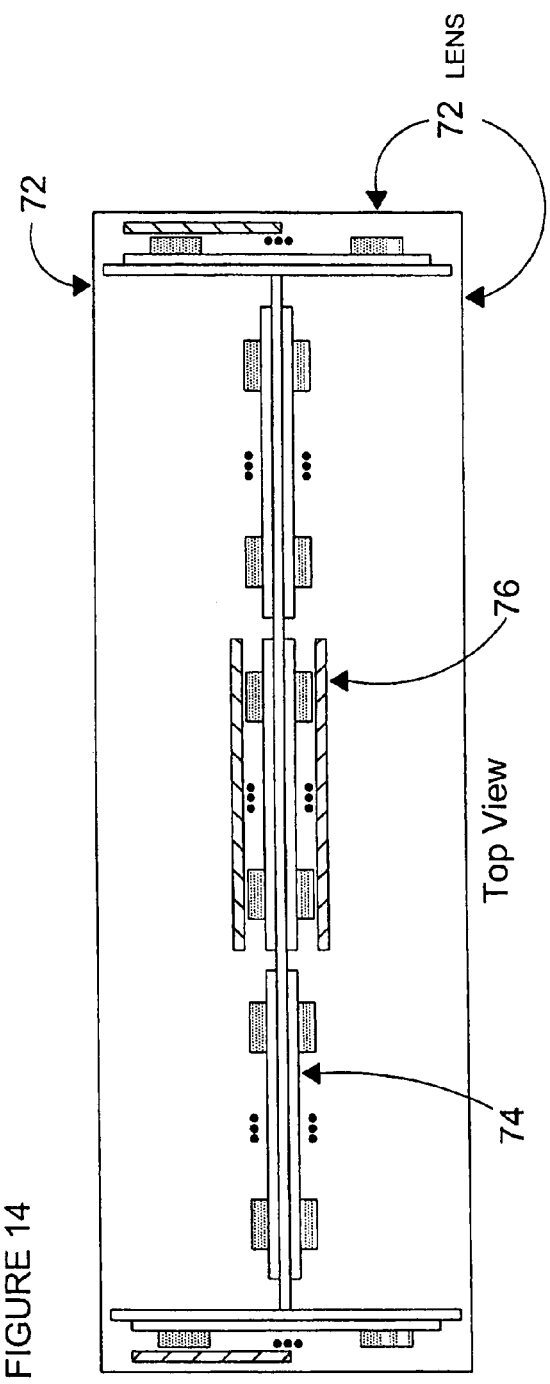
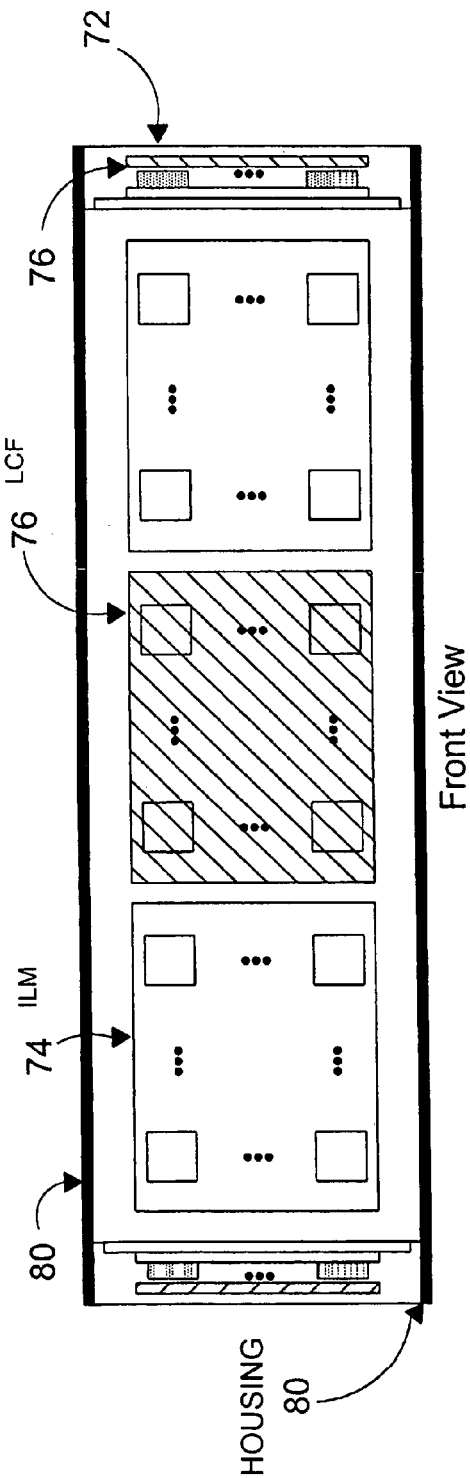
FIGURE 14
FIGURE 15

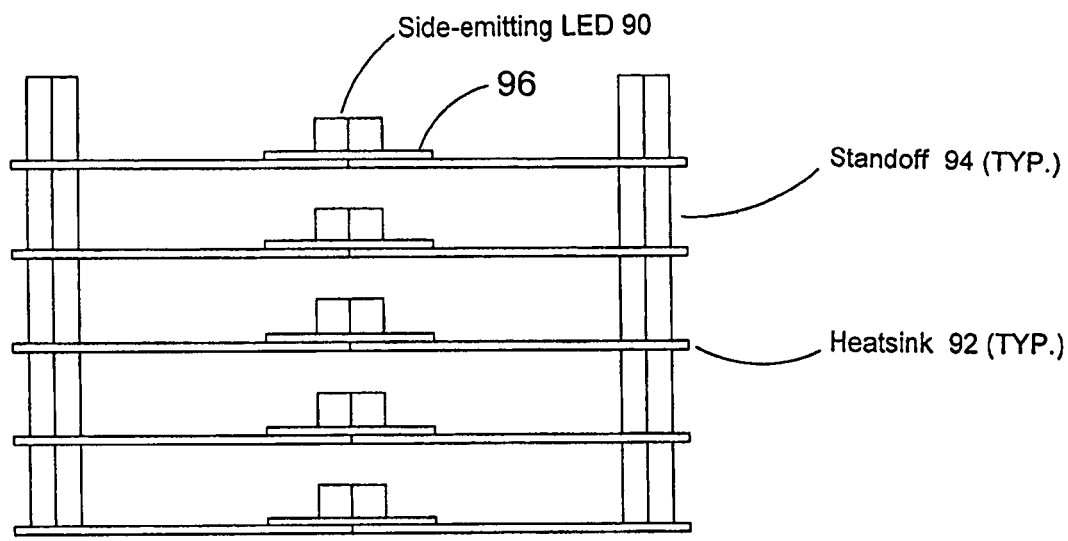
Figure 16
Figure 17
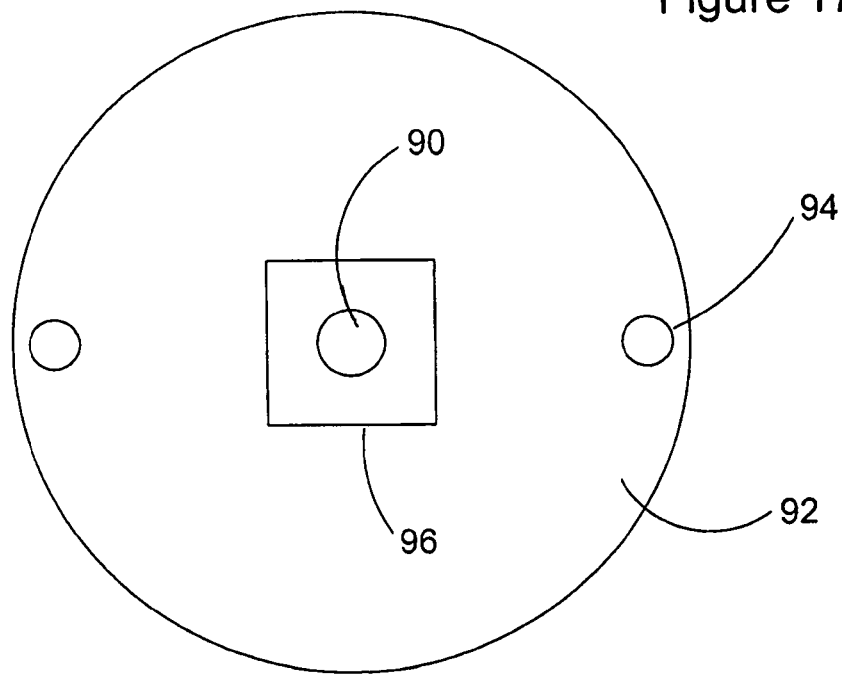

FRONT VIEW

102 Heatsink
100 LED/Optics Unit
104 Faceplate
106 Standoff

TOP VIEW

Back View

SOLID-STATE WARNING LIGHT WITH ENVIRONMENTAL CONTROL

The present invention relates generally to warning lights, and more specifically, to solid-state (LED) warning lights whose operation is modulated in response to environmental conditions, generally under the supervision of a microprocessor or dedicated control circuit.

BACKGROUND OF THE INVENTION

Warning lights are useful and desirable on many types of vehicles, machinery, and other objects (buildings, towers, people, animals, etc.) to announce the presence, location, operation mode, status, or function of the vehicle, machine, process or event. The nature of warning lights requires them to be employed in harsh physical environments, often in remote or difficult-access locations, and with limited availability of electrical power.

Solid-state light emitting diodes (LEDs) are well-suited for use in warning lights due to characteristics such as good electrical efficiency, small size and weight, and rugged construction compared to other light sources such as incandescent bulbs. However, existing LED warning lights suffer from a number of problems, including the following: circuit complexity (resulting in high production cost and poor reliability), low electrical-to-luminous power conversion efficiency (resulting in unwanted higher operating temperatures and unwanted higher electrical power consumption), and limited ability to operate from a range of electrical supply voltages.

In particular:
LED constant voltage circuits require the use of series resistors, causing unwanted loss of electrical power as heat;
LED constant current circuits require the use of additional circuitry to measure and control electrical power exciting the LED; and
unregulated circuits require heat producing series resistors and are limited to operation over a narrow range of electrical supply voltages, therefore limiting their application.

One strategy for controlling LEDs and LED assemblies is to minimize the output power of the LEDs with respect to ambient lighting levels. In other words, some LED driver systems try to provide only enough power to ensure that the LEDs are visible against the backdrop of the ambient lighting. While such an approach might minimize power consumption. It does nothing to improve on the actual efficiency of the conversion from power to light. More important, by reducing the contrast between the warning light and the ambient lighting, the possibility of warnings being missed, increases. In many applications this is a tradeoff that is simply not acceptable.

There is therefore a need for an improved LED warning light.

SUMMARY OF THE INVENTION

It is therefore an object of the invention to provide a novel warning light which offers some operational advantage over the prior art.

One aspect of the invention is defined as a warning light comprising: an assembly of light emitting diodes (LEDs); a control circuit operable to drive the LEDs; one or more environmental sensors coupled to the control circuit; the control circuit further including: means for receiving data and/or measurements from the environmental sensors; means for calculating optimal operating parameters for the LEDs, based on the environmental data and/or measurements; and means for driving the LEDs in accordance with said calculated optimal operating parameters.

Another aspect of the invention is defined as a warning light comprising: a plurality of separate LED sub-assemblies on rigid printed circuits, attached to a base circuit board that provides both mechanical and electrical connection between the rigid circuit boards and the base circuit board, the separate LED sub-assemblies being pointed in different directions; a control circuit operable to drive said separate LED sub-assemblies; one or more environmental sensors coupled to said control circuit; the control circuit further including: means for receiving data and/or measurements from the environmental sensors; means for calculating optimal operating parameters for the separate LED sub-assemblies, based on the environmental data and/or measurements; and means for driving the separate LED sub-assemblies in accordance with the calculated optimal operating parameters; allowing the assembly of a multi-directional warning light module without the need for costly flexible or bendable circuit board materials.

A further aspect of the invention is defined as a warning light comprising: an assembly of light emitting diodes (LEDs); a control circuit operable to drive the LEDs; one or more environmental sensors coupled to the control circuit; the control circuit further including: circuitry for receiving data and/or measurements from the environmental sensors; circuitry for calculating optimal operating parameters for the LEDs, based on the environmental data and/or measurements; and circuitry for driving the LEDs in accordance with the calculated optimal operating parameters.

BRIEF DESCRIPTION OF THE DRAWINGS

These and other features of the invention will become more apparent from the following description in which reference is made to he appended drawings in which:

FIGS. 14 and 15 present top and front views, respectively, of a warning light having a rectangular cross-section, employing multiple ILMS, and including light-control-film, in an embodiment of the invention;

FIGS. 16, 17 and 18 present front, top and isometric views, respectively, of a cylindrical warning light employing multiple side-emitting LEDs, in an embodiment of the invention;

DESCRIPTION OF THE INVENTION

Figure 1:
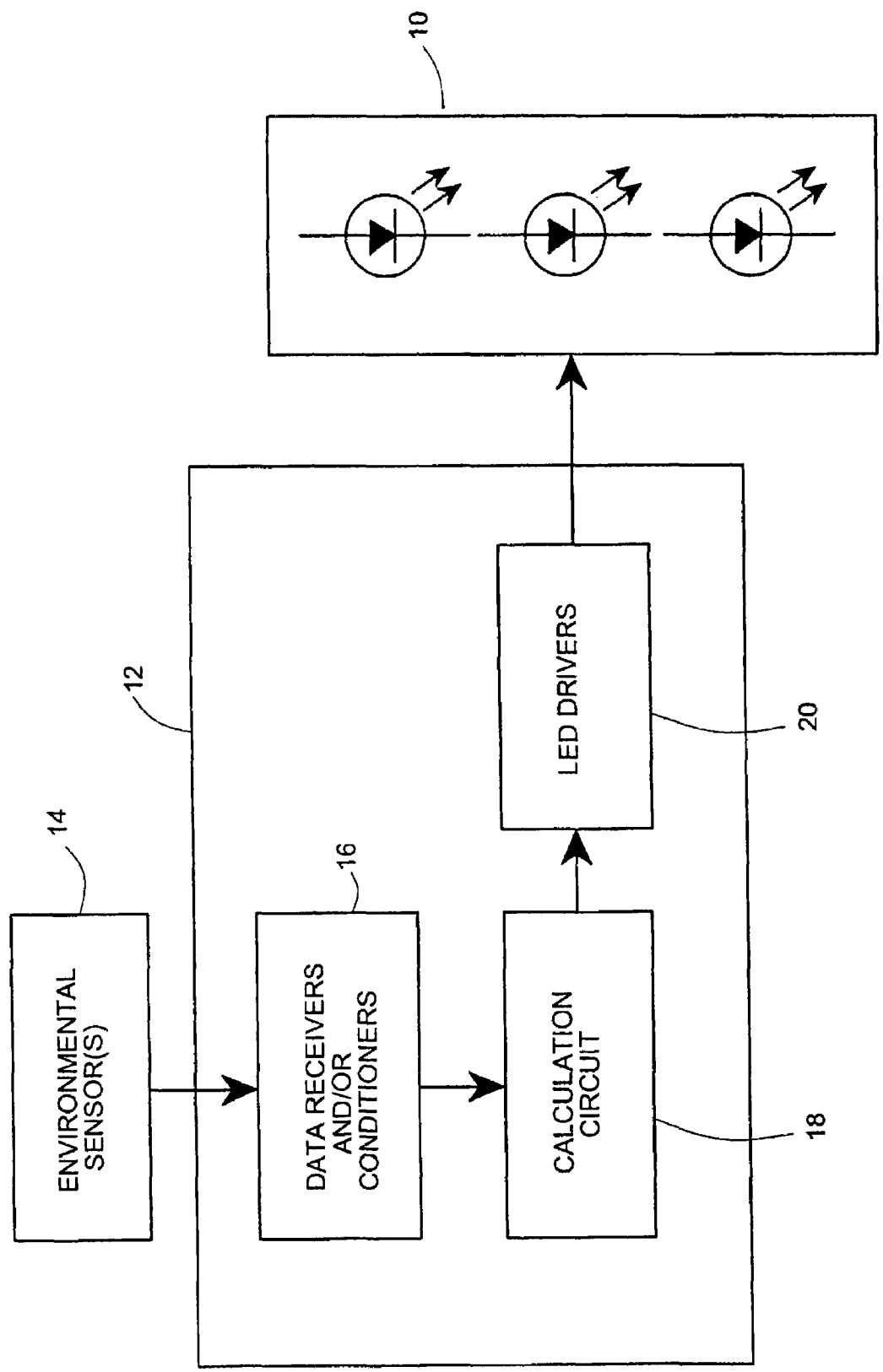
FIG. 1 presents a schematic diagram of circuit in a broad embodiment of the invention.

An electrical schematic diagram of a warning light which addresses one or more of the objects outlined above, is presented in FIG. 1. This warning light includes an assembly of light emitting diodes (LEDs) 10, a control circuit 12 operable to drive the LEDs 10 and one or more environmental sensors 14 which are electrically connected to the control circuit 12. Specific examples will be described in greater detail hereinafter, but may include, for example, devices to sense the following environmental conditions:
ambient temperature;
internal temperature;
ambient light level;
emitted light level;
relative humidity;
liquid moisture;
mechanical tilt;
vibration;
physical shock;
marine wave height and period;
air pressure;
barometric pressure;
solar cell voltage;
battery voltage;
supply voltage.

Typically, these sensors will be mounted on a circuit board within the warning light, but may also be mounted externally or on an outside surface of the warning light.

A number of environmental sensors and their application strategies are described hereinafter, but two that are particularly useful are the monitoring of supply voltage and ambient temperature. The control circuit 12 can adjust to the available power level of the supply voltage, varying the frequency and/or duty cycle of pulses to the LEDs 10 (duty cycle referring to the percentage of the time that the LEDs are illuminated in proportion to the time they are dark). For example:
if the available voltage level is too high, the frequency of pulses to the LEDs 10 can be reduced. Using the inductive driver circuit described hereinafter, the LEDs 10 will not be overdriven; or
if the available voltage level is too low, the number of LEDs 10 being driven can be reduced, or the duty cycle of the pulses to the LEDs 10 can be decreased to conserve power.

The power level that LEDs 10 can withstand has to be de-rated with high ambient temperatures. Using an ambient temperature sensor, LEDs 10 can be driven at their optimal levels without fear of damage.

The control circuit 12 also includes the following components:
1. circuitry for receiving data and/or measurements 16 from the environmental sensors 14;
2. circuitry for calculating optimal operating parameters 18 for the LEDs 10, based on the environmental data and/or measurements; and
3. circuitry for driving 20 the LEDs 10 in accordance with the calculated optimal operating parameters.

The actual hardware and/or firmware that is used to implement the circuitry for receiving data and/or measurements 16 will depend on the general design strategy and upon the nature of the environmental sensors 14 themselves. In some cases, the environmental sensors 14 may consist simply of switches which are actuated when a certain condition arises, which can be handled by the control circuit 12 using a simple digital input. In other cases, analogue signals may be provided by the environmental sensors 14 which require some conditioning or filtering, an analogue input on the control circuit 12 or external conversion from analogue to digital signals. These design issues would be clear to one skilled in the art from the teachings herein.

Clearly, the control circuit 12 itself could be implemented using a dedicated circuit, ASIC (application specific integrated circuit), microcontroller, microprocessor or the like, and any necessary supporting components. This design choice will generally determine how the circuitry for calculating optimal operating parameters 18 and the circuitry for driving 20 the LEDs 10 will be effected. The circuitry for calculating optimal operating parameters 18, for example, could be effected in a microprocessor in the manner of actual calculations which are performed. Alternatively, it could be implemented by indexing a stored lookup table.

Microprocessors and microcontrollers are the most logical choices because of their great processing power and programming flexibility. Different models of LEDs will have different performance parameters. Having a programmable controller makes the task of accommodating a new LED model much easier.

The circuitry for driving 20 the LEDs 10 will be determined by the number and size of the LEDs 10 (which determines the power required), the manner in which the LEDs 10 are wired, and the patterns that are desired. LEDs 10 are commonly wired in series, parallel, a combination of the two, or individually. The invention is not limited by the manner in which the LEDs 10 are wired. Clearly, wiring the LEDs 10 individually provides the greatest flexibility in the generation of different patterns. Ganging LEDs 10 together however, results in much less complexity and less wiring.

This circuit provides a solid state warning light with many advantages over the prior art. Most importantly, it optimizes the light output in view of environmental conditions. This is quite distinct from prior art warning lights described in the Background, which typically endeavour to minimize the power consumed, and hence, minimize the output light level with respect to certain conditions. The prior art does not teach that the light level should be optimized, but on the contrary, that it should be minimized—the prior art attempts to set the lighting level at the minimal acceptable level with respect to the ambient light level.

A number of various embodiments of the invention will now be described. These embodiments address a number of the other problems found in the art.

Figure 2:
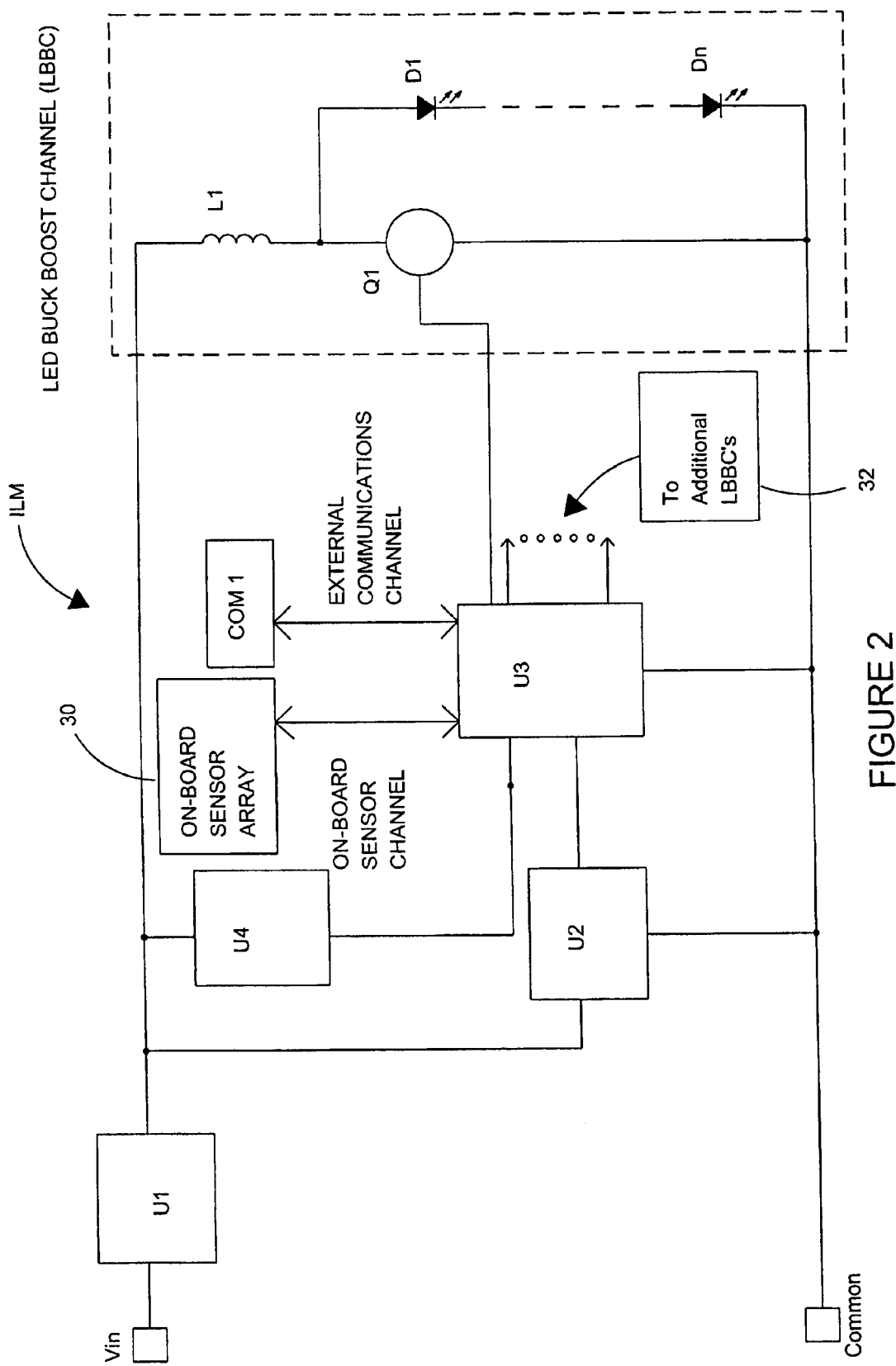
FIG. 2 presents a schematic diagram of an integrated LED module (ILM) including an LED Buck Boost Channel (LBBC) in an embodiment of the invention.

FIG. 2 presents an electrical schematic diagram of a warning light in which LEDs are excited by an inductive switch-mode boost circuit controlled by a microprocessor. This circuit may be operated from supply voltages where the sum of the LED junction voltage drops is greater than the supply voltage.

All components and circuit may be constructed on a single printed-wiring circuit board which is referred to herein as an Integrated LED Module (ILM). The LEDs D1 to DN are driven by an LED Buck Boost Channel (LBBC). Transistor Q1 should be a transistor with the characteristic of low on-state resistance (much less than one ohm). L1 should be an inductor with low resistance and high inductance value (highest Q factor practical). D1 to DN should be a series branch of LEDs of high output luminous flux and capable of high current operation. The number of LEDs should be chosen so as to have a cumulative forward junction voltage drop higher than the supply voltage.

U3 microprocessor (or microcontroller) should be of low power consumption and with suitable output pin drive capability to reliably assert the control pin of transistor Q1 alternately from off-state to on-stab, U1 represents an over-current protection device and may be a suitably rated positive-temperature-coefficient fuse. U2 represents a low-power voltage regulator to provide a suitable current supply for the microprocessor U3.

U4 represents an Analog-to-digital convertor used to detect and measure the electrical supply voltage. This information is used by the microprocessor to adjust the pulse duration and pulse repetition rate used to excite the LEDs P1 to DN. The microprocessor U3 may use software look-up tables or an algorithm to determine the optimum pulse timing to apply to the LED excitation circuit. The microprocessor U3 alternately switches the transistor Q1 from off-state to full conduction on-state at a rate of approximately 100 KHz (design frequency can be chosen over a broad range to match the choice of inductors and LEDs).

The high pulse rate (approximately 100 KHz) of the LED excitation circuit results in a visual effect of apparent constant illumination. An observer has no impression of pulsation of the LEDs emitted light.

During the transistor Q1 on-state, current flow increases through the inductor L1 to the common node, developing an electromagnetic field in the inductor L1. No conduction occurs through the LEDs D1-to-DN at this time. During the transistor Q1 off-state current flows through the inductor L1 and LEDs D1 to ON causing light to be emitted. A repetition rate should be chosen so as to allow the electromagnetic field in L1 to completely collapse and all current flow through the LEDs to cease before starting a new Q1 on-state.

A discrete rectification diode is not employed in this circuit as this function is performed by the LED junction(s). An output filter capacitor is not employed either as there is no requirement for voltage ripple smoothing. Hence, the entire excitation circuit is implemented without any resistors, capacitors or rectifying diodes.

LEDs are a very efficient and durable light source. Other light sources used in the art such as incandescent or halogen bulbs, and xenon flash tubes are less durable and less power efficient.

LEDs however, require a controlled electrical power source for operation. The inductive excitation circuit of the invention is very efficient, straightforward in design and inexpensive. This is in contrast to the typical LED driving circuits used in the art which stiffer from problems such as:

additional circuit complexity, resulting in unwanted higher production cost and poorer reliability;

lower electrical-to-luminous power conversion efficiency, resulting in unwanted higher operating temperatures and unwanted higher electrical power consumption; and limited ability to operate from a range of electrical supply voltages.

In particular, the LED driving circuits used in the art are generally one of the following designs:

1. LED constant voltage circuits, which require the use of series resistors. This design has the poorest efficiency as most of the electrical energy is wasted as heat;
2. LED constant current circuits which require the use of additional circuitry to measure and control electrical power exciting the LED. Typically, current regulated LED circuits employ series current-sense resistor and sensitive analog-to-digital conversion circuits; expensive and complex to build, and having a high parts count; and
3. unregulated circuits require heat producing series resistors and are limited to operation over a narrow range of electrical supply voltages, therefore limiting their application.

In contrast, the inductive excitation circuit of the invention is inexpensive, has a low parts count, does not use heat producing resistors, and can be monitored and controlled by the microprocessor. The pulsed direct-current nature of the inductive excitation circuit also enables operation from a wide range of electrical supply voltages; therefore, it can be operated from a wide range of electrical supplies including regular and rechargeable batteries, solar panels and automotive electrical systems.

Using a microprocessor U3 at the heart of this circuit provides for great flexibility. The microprocessor can perform measurements on various environmental factors affecting the warning light (such as electrical supply voltage, ambient temperature, etc.) and automatically adjust its operation according to need. These environmental sensors 30 are generally mounted on the same circuit board as the microprocessor U3 but can also be installed on the housing of the ILM. The microprocessor U3 can also provide additional functionality including the following:

1. the microprocessor U3 may excite the LEDs D1 to DN in bursts so as to produce obvious pulses of light. The bursts may be of very short duration so as to give the appearance of a "strobe-light", or in longer duration bursts to produce a blinking or flashing effect;
2. the microprocessor U3 could also send and receive information from a remote control or through a communications channel, making the warning light part of a network. The ability to communicate over a network allows the new warning light to respond in useful sways to instructions from a remote source or to automatically adjust its own operation to changes in its operating environment in co-operation with other devices on the network. As part of a network the warning light can receive commands via a data-communications network (using interface COM1) to alter its operation, for example, receiving commands to:
   a. start or stop operation in response to certain events;
   b. changing its operation from a strobing effect to a flashing effect;
   c. reducing output power in a controlled way during periods of scarcity of the electrical power supply (low batteries, lack of light for solar cells or grid brown-out, for example); or d. increasing power output in a controlled way during times of increased need such as impaired atmospheric visibility.

The communications port could also be used to transmit data from the various environmental sensors or advise on the status of the warning light itself. Communications between the warning light and a remote control or network may be implemented by a single or multi-wire interface or over a wireless line such as infrared (IR) or radio frequency (RF) link. Many such computer, communication and instrumentation networks are known in the art;

3. the microprocessor U3 may include an on-board, time-of-day clock and calendar allowing the warning light to modify operation in response to diurnal and seasonal requirements; or
4. additional banks of LEDs 32 could be driven by the microprocessor U3, with different control signals being sent to different banks of LEDs. This could be used to generate different patterns or displays such as direction arrows or chasers. Different colours could also be used for the different banks of LEDs.

Figure 3:
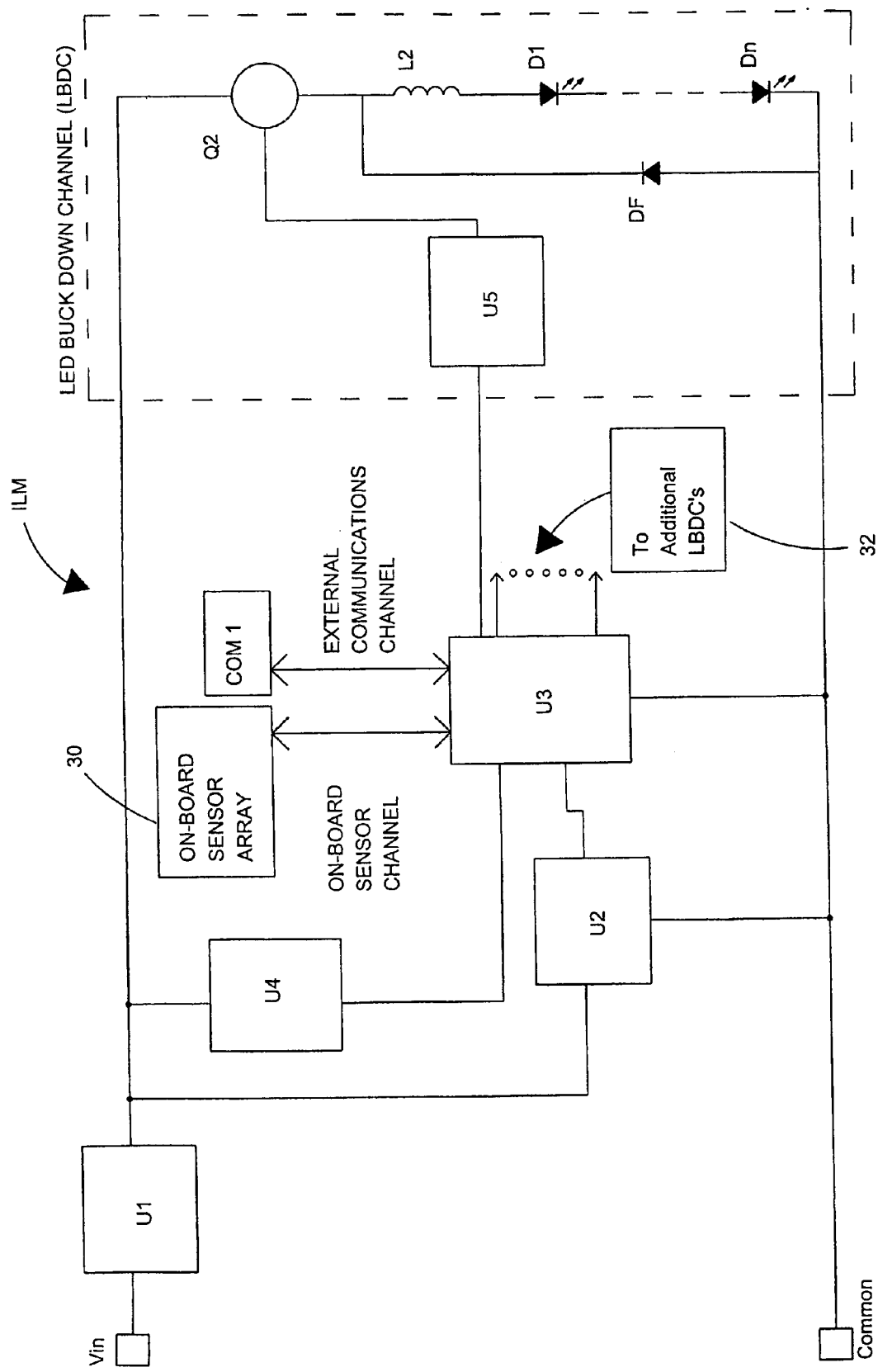
FIG. 3 presents a schematic diagram of an integrated LED module (ILM) including an LED Buck Down Channel (LBDC) in an embodiment of the invention.

FIG. 3 presents an electrical schematic of a circuit that is similar to that of FIG. 2, except that it employs an LED Buck Down Channel (LBDC) rather than a LED Buck Boost Channel (LBBC). This circuit is useful where the sum of the LED junction voltage drops may be less than the supply voltage. This circuit is that same as FIG. 2 except that the LBDC circuit feeds the LEDs D1 to DN in series with a transistor Q2 and an inductor L2, and employs a voltage level shifting device U5 to bias the transistor Q2. it also includes a "freewheel" diode DF, which carries the reverse recovery current for the LBDC. Otherwise, the circuit is the same as that of FIG. 2.

Figure 4:
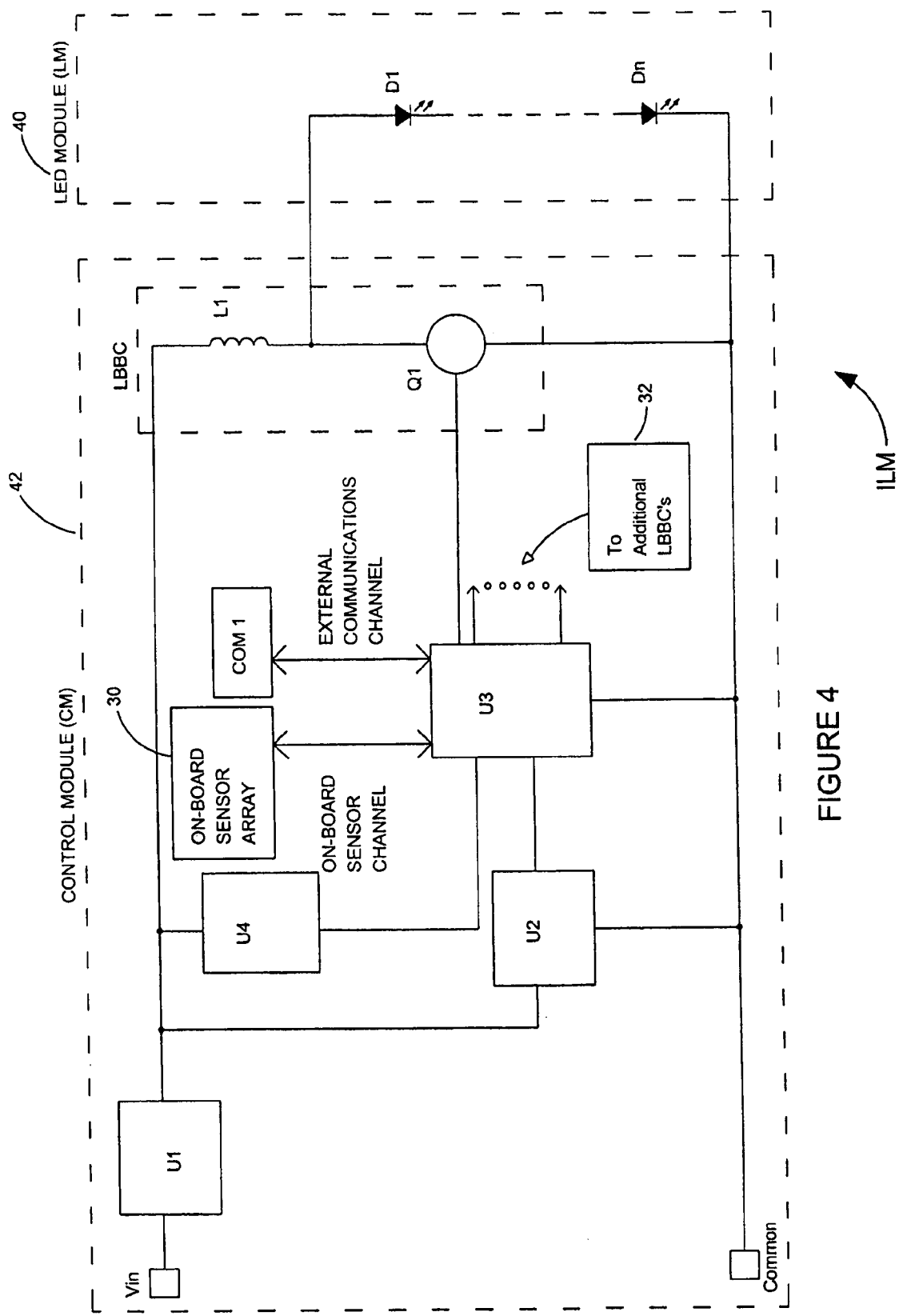
FIG. 4 presents a schematic diagram of a warning light circuit in a CM-LM (Control Module-LED Module) configuration, including an LBBC circuit in an embodiment of the invention.
Figure 5:
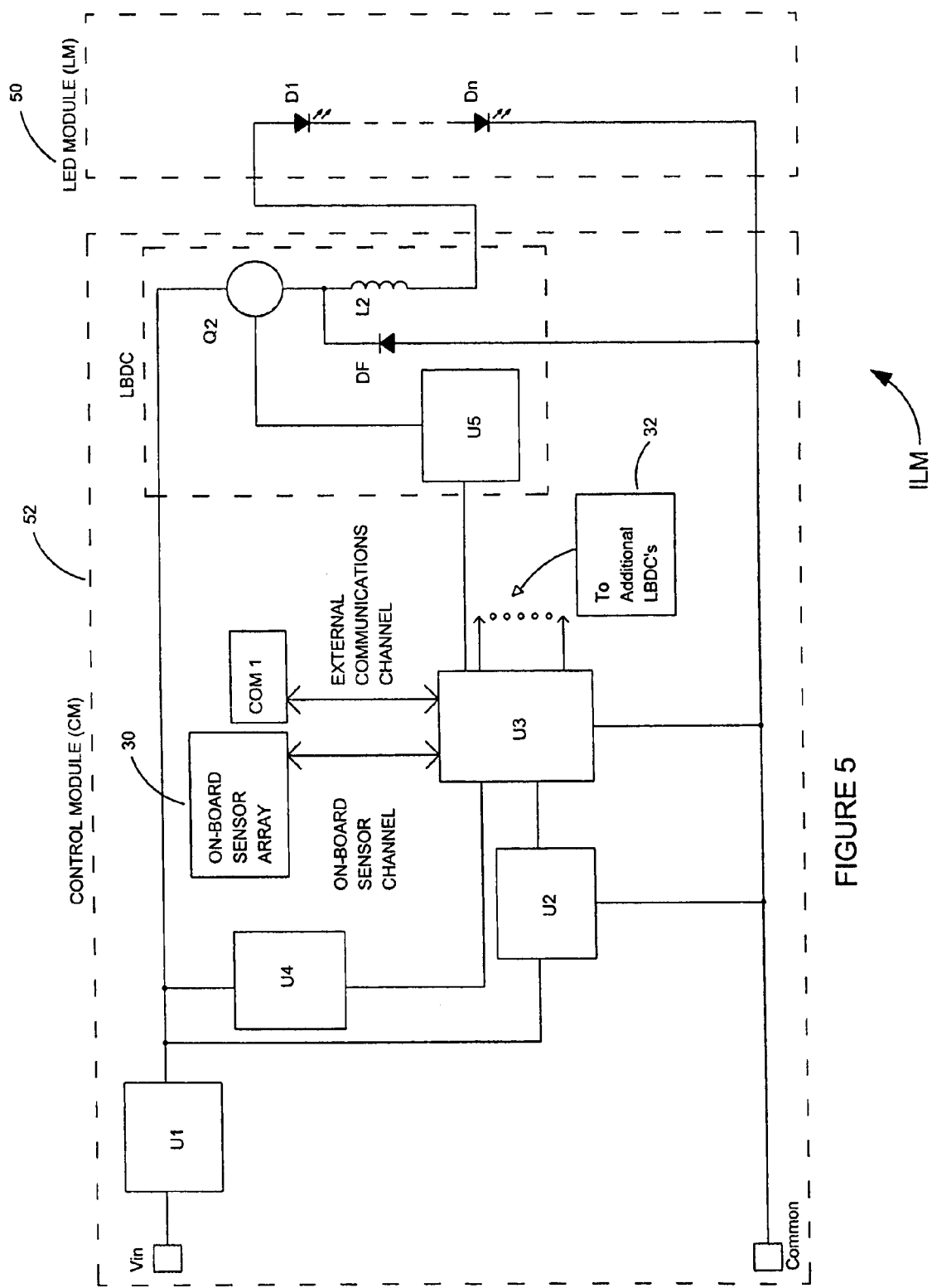
FIG. 5 presents a schematic diagram of a warning light circuit in a CM-LM configuration, including an LBDC circuit in an embodiment of the invention.

FIG. 4 is the same as FIG. 2, except that rather than providing all of the components of the circuit on a single board, in the form of an ILM, this Figure presents the division of components where separate LED Modules (LM) 40, and Control Modules (CM) 42 are used. Similarly, FIG. 5 presents the division of components that would be used for the circuit of FIG. 3, again, where the LED module (LM) 50 is separate from the module containing the microprocessor U3 and excitation circuitry, control module (CM) 52.

Figure 6:
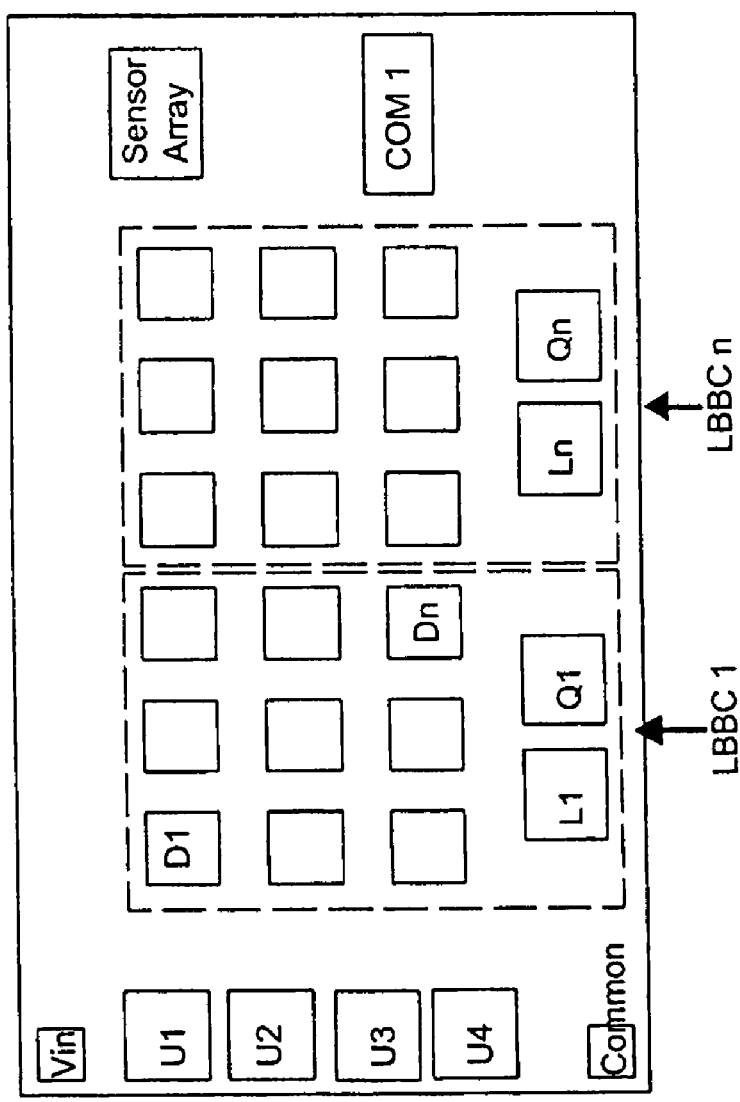
FIG. 6 presents an exemplary physical layout of a planar ILM including an LBBC circuit in an embodiment of the invention.

FIG. 6 presents an exemplary physical layout of a planar warning light module using the LBBC circuit of FIG. 2. In this case only two LBBC circuits are presented: LBBC1 and LBBCn, but many more could also be used. As shown, the LEDs are preferably arranged adjacent their respective inductors L1, Ln and transistors Q1, Qn. The balance of the electronic components are preferably installed in accessible locations which do not interfere with the physical positioning of the LEDs or the potentially hot excitation components.

Figure 7:
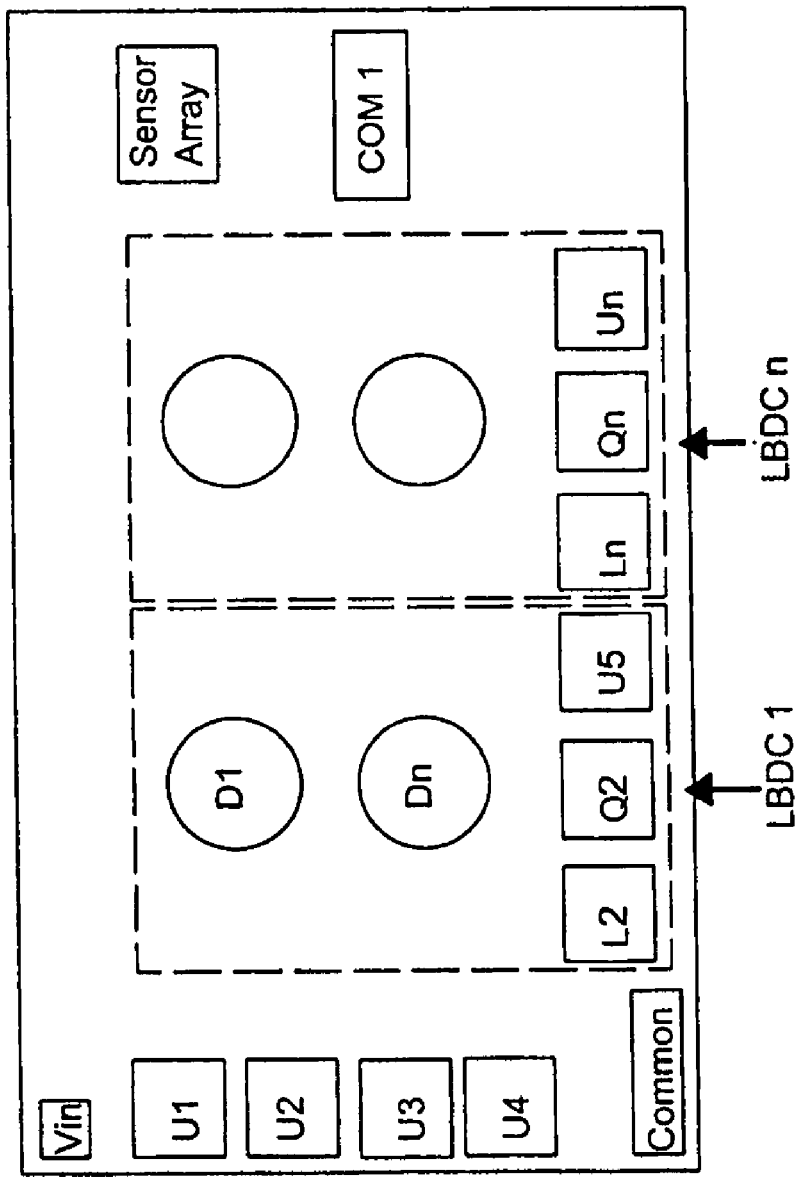
FIG. 7 presents an exemplary physical layout of a planar ILM including an LBDC circuit in an embodiment of the invention.

FIG. 7 similarly presents an exemplary physical layout of a planar warning light module using the LBDC circuit of FIG. 3. In this case only two LBDC circuits are presented: LBDC1 and LBDCn, but many more could also be used. As shown, the LEDs are preferably arranged adjacent their respective inductors L2. Ln and transistors Q2, Qn. The balance of the electronic components are preferably installed in accessible locations which do not interfere with the physical placement of the LEDs or the potentially hot excitation components.

Figure 8:
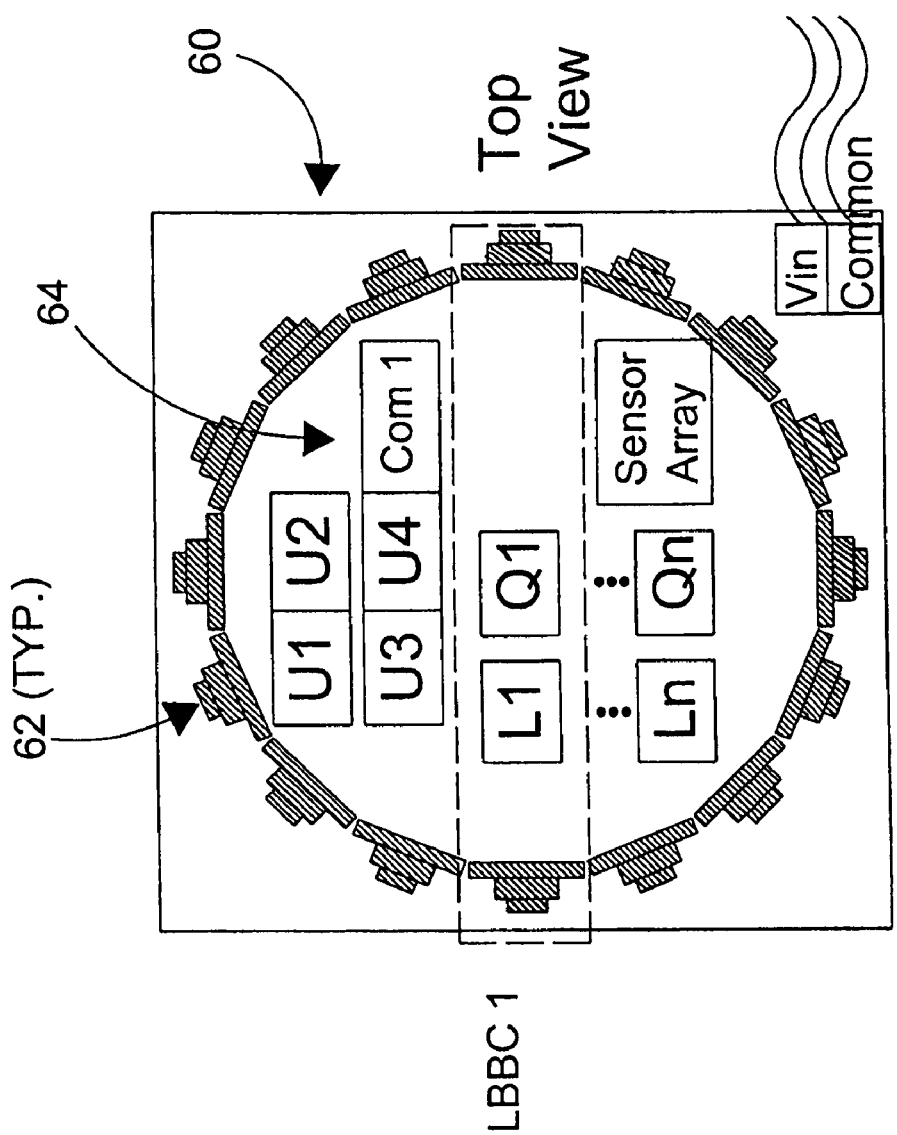
FIGS. 8 and 9 present top and front views, respectively, of a cylindrical warning light using an ILM including an LBBC circuit, in an embodiment of the invention.
Figure 9:
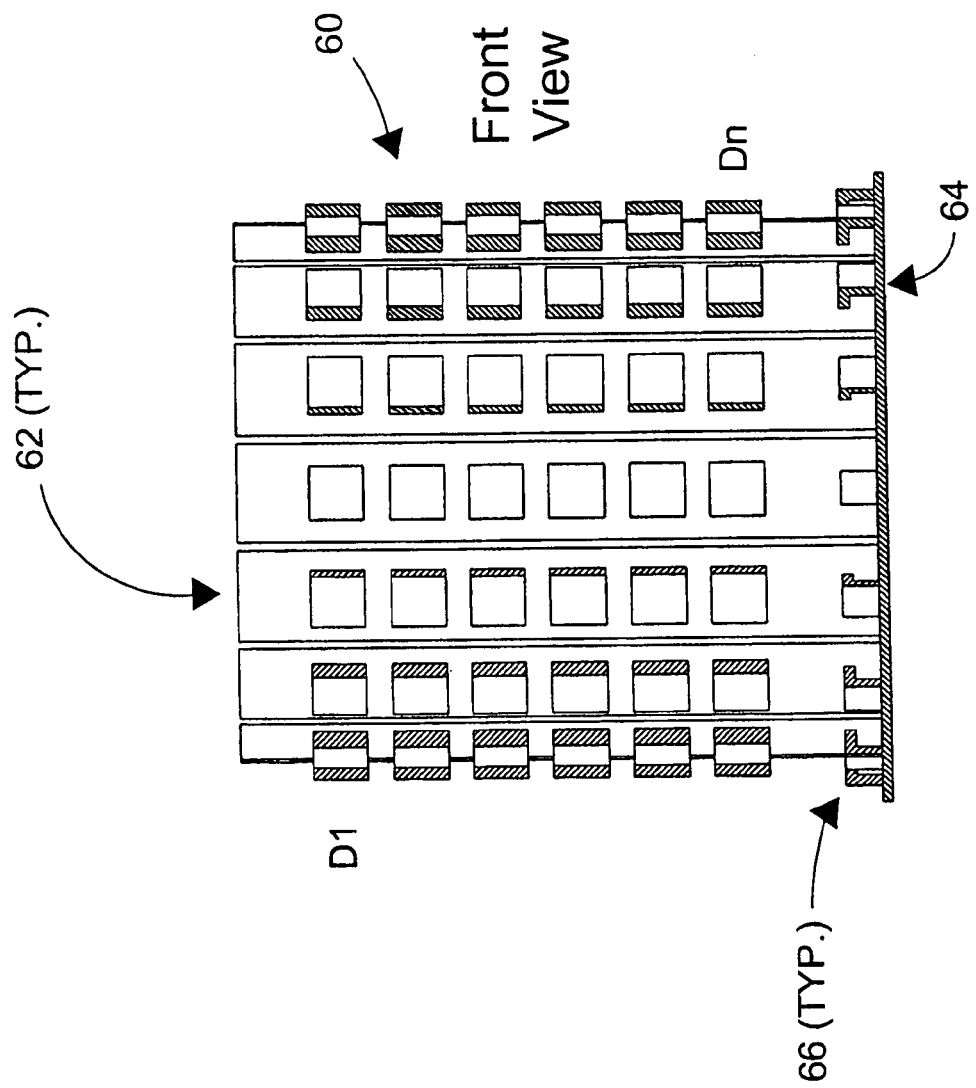

FIGS. 8 and 9 present top and front views respectively, of a physical layout of a cylindrical warning light in an embodiment of the invention. A rugged, lightweight housing of extruded aluminum alloy with an anodized surface and a clear, colourless polycarbonate lens would be used to protect the Integrated LED Module (ILM) 60 shown in these two figures. Silicone gaskets provide weather-resistant joints between housing and lens, and around the cable entry.

The ILM assembly presented in FIGS. 8 and 9 may be constructed with conventional low-cost Printed Wiring Circuit Assembly techniques. The cylinder is formed by attaching multiple, rigid, LED subassemblies 62 to a rigid base circuit board 64 by means of multi-pin right-angle pin headers 68 that provide both mechanical and electrical connection between the circuit boards. This construction technique allows the assembly of an omni-directional warning light module without the need for costly flexible or bendable circuit board materials.

A warning light of this configuration can be used to emulate a rotating warning light without any moving parts. This is done simply by illuminating successive columns of LEDs or groups of columns, in a pattern which cycles around the warning light. Being entirely solid state, this warning light is physically lighter, more durable and less expensive than comparable mechanical warning lights.

Figure 10:
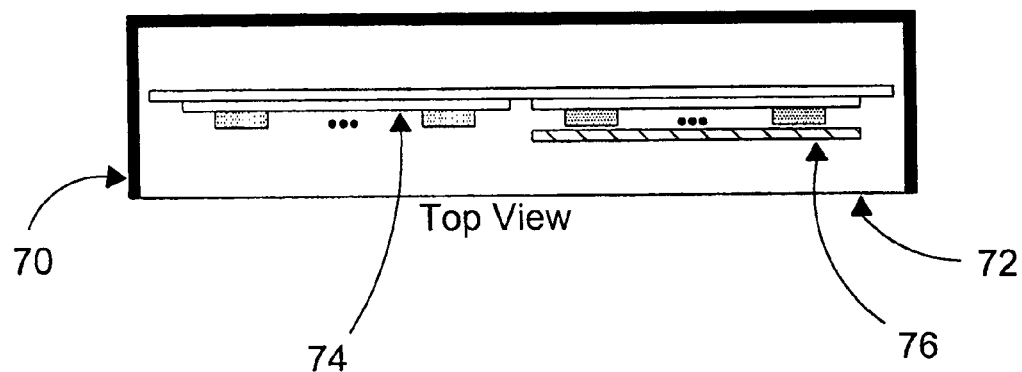
FIGS. 10 and 11 present top and front views, respectively, of a planar warning light including light-control-film, in an embodiment of the invention.
Figure 11:
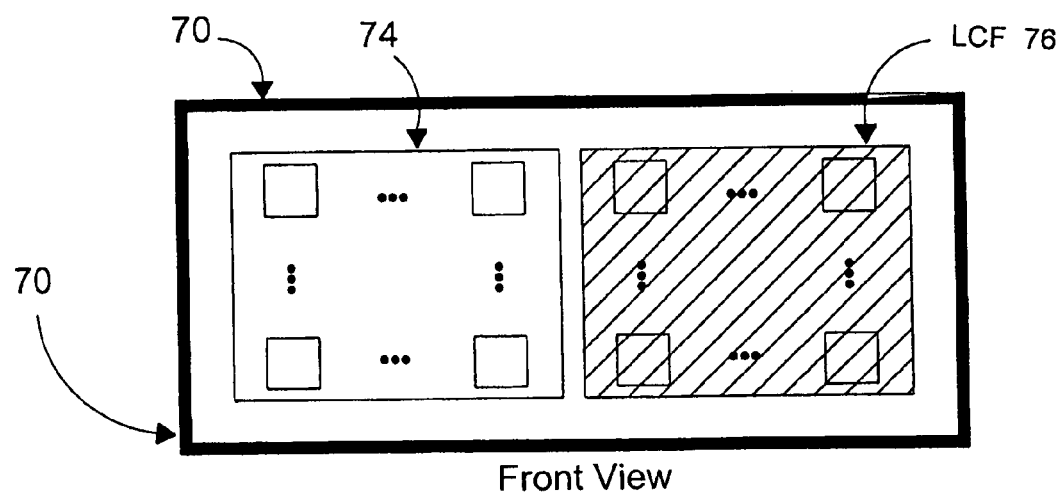

FIGS. 10 and 11 present top and front views respectively, of a physical layout of a planar warning light in an embodiment of the invention. Like the warning light of FIGS. 8 and 9, this warning light would typically be encased in a rugged, lightweight housing 70 of extruded aluminum alloy with an anodized surface and a clear, colourless polycarbonate lens 72 would be used to protect the Integrated LED Module (ILM) 74 shown in these two figures. Silicone gaskets provide weather-resistant joints between housing and lens and cable entry. Selectively applied Light Control Film (LCF) 76 refracts light emitted by the LEDs to modify the viewing angle. A multi-conductor cable (not shown) may provide electrical power and connections to a data-communications network.

Most light sources (including LEDs) require a means to control the direction and intensity of the emitted light. Lenses and reflectors can be expensive to manufacture and have size and shape characteristics that limit their application. Glass lenses, for example, are bulky, heavy, expensive and fragile. Plastic lenses are also bulky and have poorer light transmission characteristics. As well, injection-moulds for plastic lens have high initial cost. Reflectors tend to be large and bulky and their geometry favours the use of single point-source light types.

Light Control Film (LCF) 76 may be used to reflect and refract light from the LEDs into useful patterns. LCF is a thin transparent film that contains microscopic features (micro-louvers, dots or squares, for example) that control the direction of visible light passing through it. Light entering the film from one side can be emitted from the other side with its path altered by a significant angle, for example, being refracted by an angle of 30 degrees. The film may be constructed of polycarbonate and is available from 3M corp. LCF is thin, rugged and flexible, and can be easily worked to produce a wide variety of light control effects.

LEDs may also be selected which contain optical lenses integral with the body of the LED package and so may not require the use of additional lenses or reflectors to focus the emitted light.

An array of planar warning lights may be assembled into a single housing for use on the roof of a service vehicle to replace the functionality of a "light bar". The network capability of the array simplifies the installation and maintenance by eliminating the large and heavy bundle of cables traditionally used to control a "light-bar".

Figure 12:
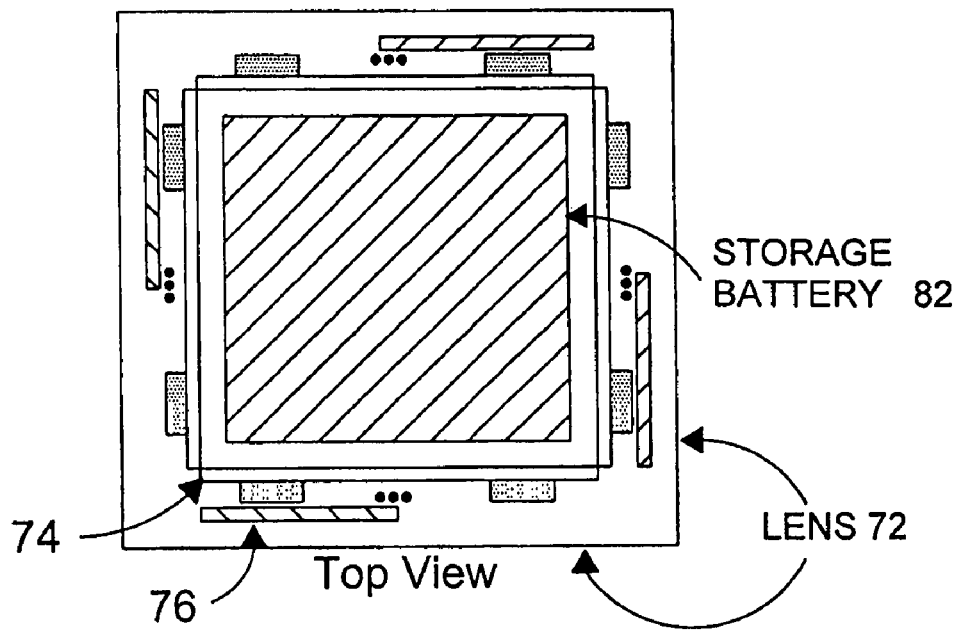
FIGS. 12 and 13 present top and front views, respectively, of a warning light having a square cross-section, and including light-control-film, in an embodiment of the invention.
Figure 13:
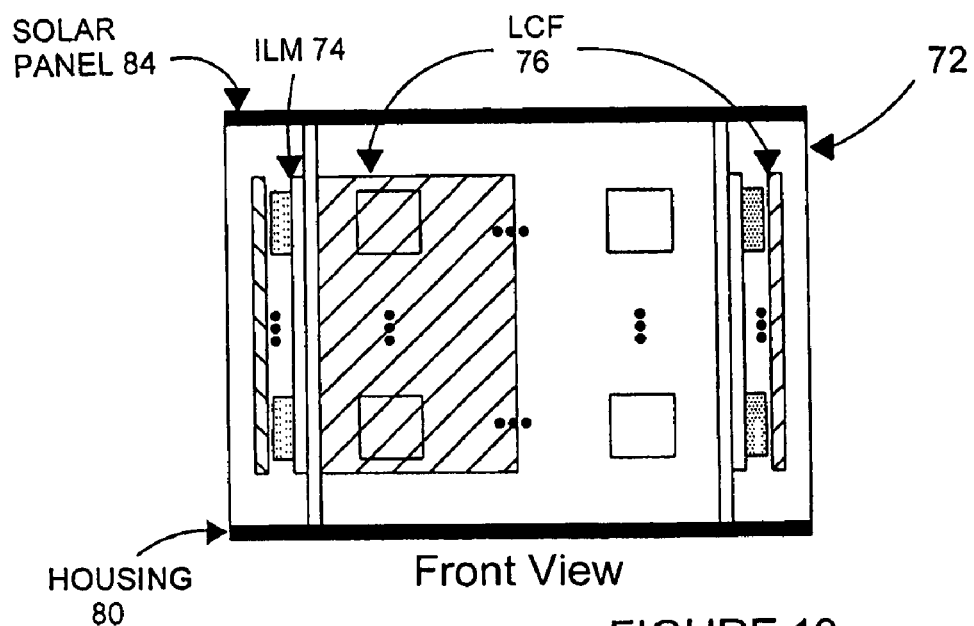

FIGS. 12 and 13 present top and front views respectively of a rectangular embodiment consisting of four ILMs 74 in a common housing. Housing 80 may be substantially square, rectangular, cylindrical or any suitable shape. Light emitted by the LEDs is generally perpendicular to flat planes, but is refracted through 360 degrees by the LCF 76 to form an omnidirectional beacon. A rechargeable electrical storage battery 82 located in the center of the assembly can provide electrical power for the ILMs 74. A Solar Panel 84 mounted onto or forming the top of the housing may provide electrical power for the ILMs 74 or to recharge the battery 82. A wireless radio-frequency or infrared link (not shown) may provide connection to a data communications network. Such an assembly may operate for a years of time without any wired connections.

FIGS. 14 and 15 present top and front views respectively of a linear assembly of ILMs 74 in a common housing. ILMs 74 may contain LEDs of different colours and so be capable of replacing so-called "lightbars" used to signal vehicle identity and operation by means of colour codes (for example, Red and White indicating Police, Ambulance, Fire equipment or Blue indicating Snow removal equipment, etc.)

Figure 18:
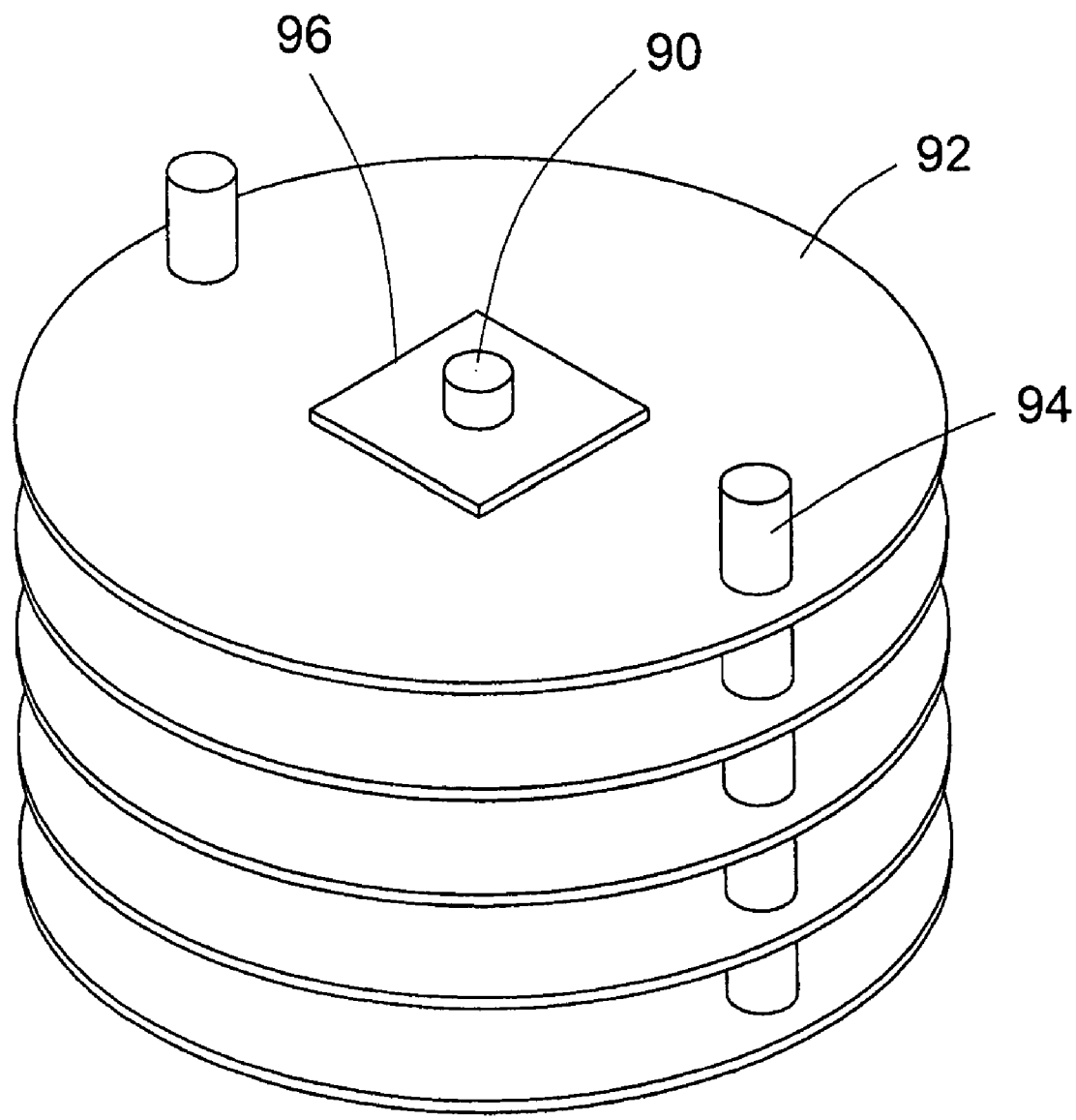

FIGS. 16, 17 and 18 present side, top and isometric views of a warning light consisting of an array of omnidirectional side-emitting LEDs 90. Each side-emitting LED 90 is mounted on its own circuit board 96 which is fixed to a heat sink which also serves as a light directing baffle. Successive circuit boards 92 are separated by means of standoffs 94.

This design is easily scalable for any number of LEDs. Different colours of LEDs could be used to implement a tower of warning signals. The assembly of FIGS. 17, 18 and 19 could also be enhanced by means of cylindrical Fresnel lenses or regular lenses.

FIGS. 19 through 23 present various views of an LED module consisting of an array of LEDs with optical lenses. The array is constructed so as to control the field-of-view.

Figure 19:
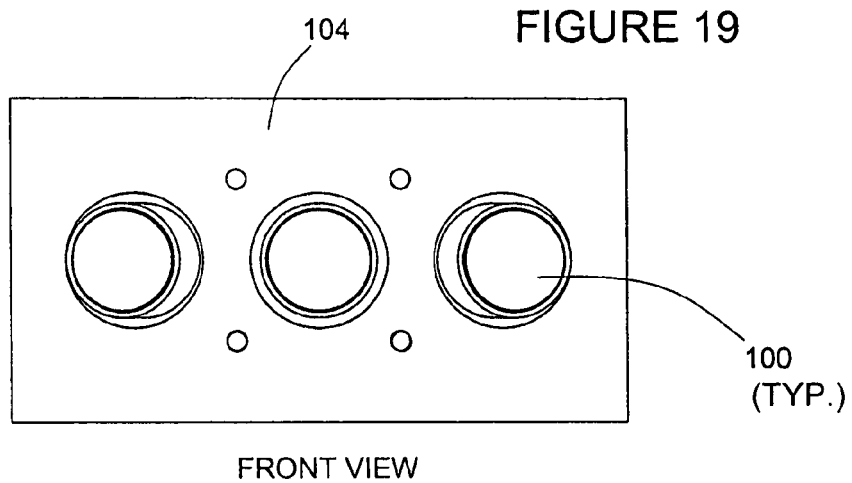
FIGS. 19, 20 and 21 present front, top and back views, respectively, of a warning light employing multiple LEDs with optical lenses, in an embodiment of the invention.
Figure 20:
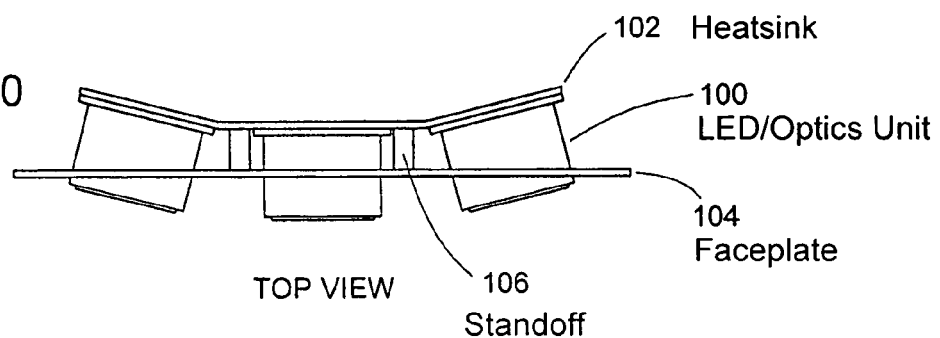
Figure 21:
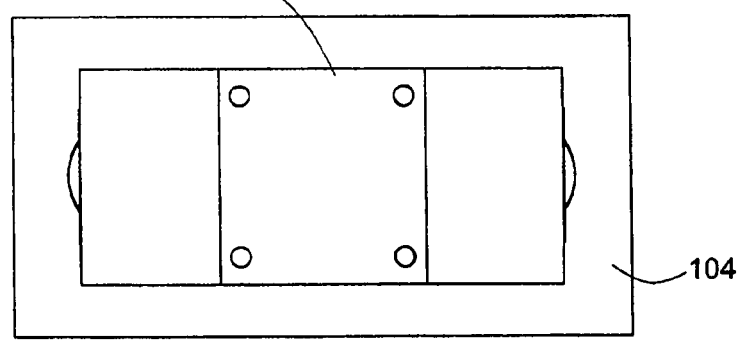
Figure 22:
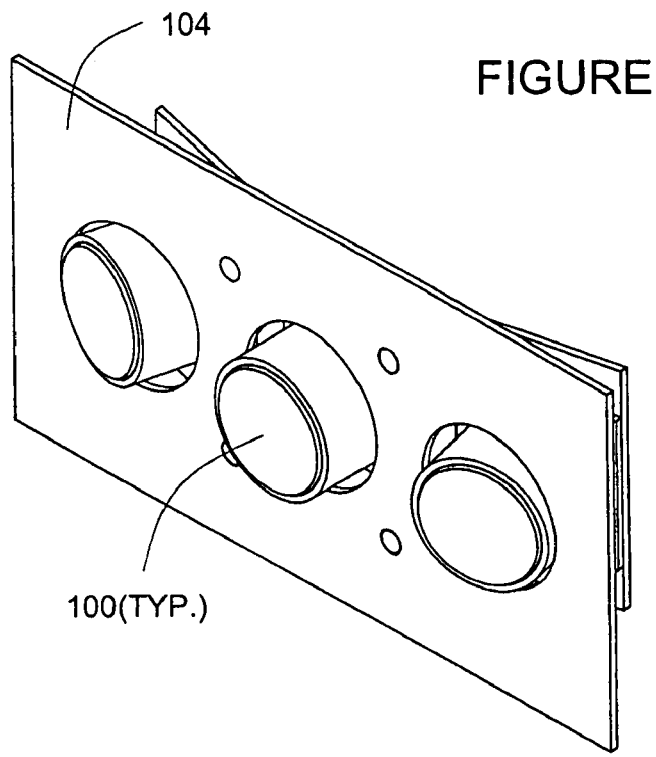
FIGS. 22 and 23 present front and rear isometric views, respectively, of a warning light employing multiple LEDs with optical lenses, in an embodiment of the invention.
Figure 23:
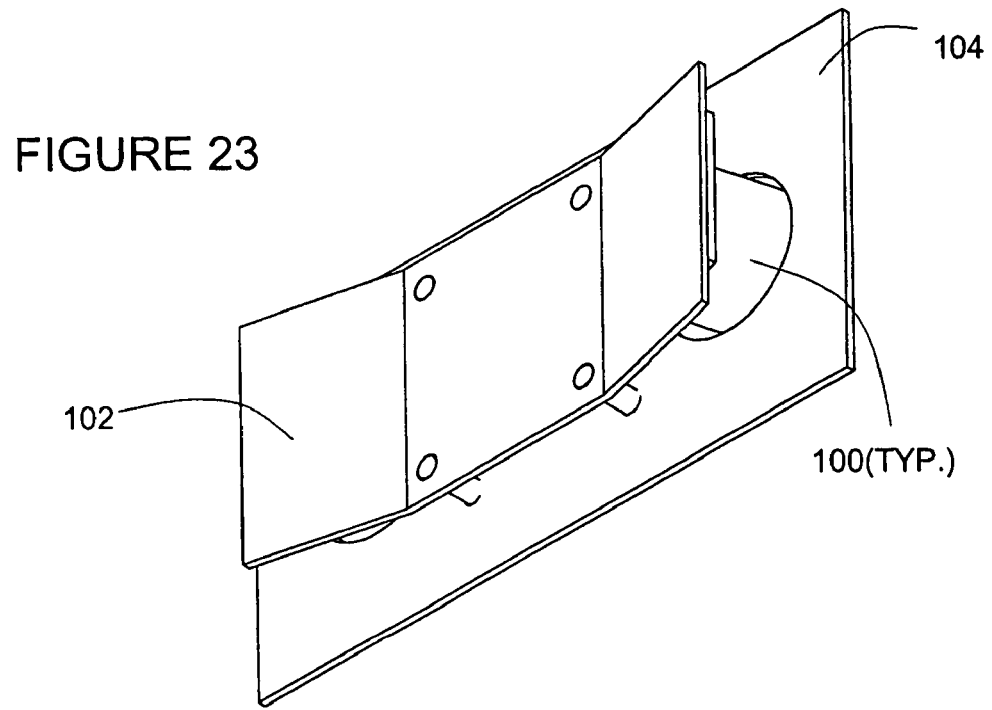

As shown in the top view of FIG. 20, three or more LED modules 100 can be mounted on a single heatsink 102, formed to direct the light in the desired directions. The faceplate 104 serves an aesthetic purpose, as well as providing physical protection and structure to the assembly. The faceplate 104 is mounted on the heatsink by means of standoffs 106. FIGS. 19 and 21 present front and back views respectively, of the same design. FIGS. 22 and 23 present front and back isometric views respectively, of the same design.

The new warning light may be used in many of the traditional warning light applications but with the benefit of reduced electrical power consumption, lower initial cost, improved reliability and longer life. Additionally, the new warning light may find new applications enabled by its improved functional characteristics.

Reduced power requirements allow longer running time and/or increased light output in applications such as battery or solar powered marine installations. Reduced initial cost and maintenance requirements improve the economic feasibility of use of the new warning light in cost sensitive and access-restricted environments.

While particular embodiments of the present invention have been shown and described, it is clear that changes and modifications may be made to such embodiments without departing from the true scope and spirit of the invention. For example, one could use polarizing film or shadow mask mounted in front of LEDs for the purpose of contrast enhancement. The contrast ratio of the warning signal to the adjacent background has a significant contribution to the noticeability of a warning light, and the use of polarizing film, shadow mask or other techniques known in the art would improve the contrast.

What is claimed is:

1. A warning light comprising:
   an assembly of light emitting diodes (LEDs);
   a control circuit operable to drive said LEDs;
   one or more environmental sensors coupled to said control circuit;
   said control circuit further including:
      means for receiving data and/or measurements from said environmental sensors;
      means for calculating optimal operating parameters for said LEDs, based on said environmental data and/or measurements; and
      means for driving said LEDs in accordance with said calculated optimal operating parameters;
      wherein said means for driving includes an inductive excitation circuit allowing the device to operate from a wide range of electrical supply voltages.

2. The warning light of claim 1, wherein said control circuit comprises a microprocessor.

3. The warning light of claim 2, wherein said microprocessor includes means for communicating over a network.

4. The warning light of claim 3, wherein said microprocessor performs said calculations using a lookup table.

5. The warning light of claim 1, wherein said inductive excitation circuit does not require any capacitors, rectifying diodes or resistors.

6. The warning light of claim 1, wherein said means for driving comprises a buck boost channel, whereby a series-connected assembly of LEDs can be driven by a voltage lower than the cumulative voltage drop across said series-connected assembly of LEDs.

7. The warning light of claim 1, wherein said means for driving comprises a buck down channel, whereby a series of LEDs can be driven by a voltage higher than the cumulative voltage drop across said series of LEDs.

8. The warning light of claim 1, wherein said one or more environmental sensors includes an analog-to-digital convertor used to detect and measure the electrical supply voltage, and said control circuit is operable to adjust power to said assembly of LEDs in response to the available voltage level.

9. The warning light of claim 1, wherein said means for driving comprises means for providing pulsed direct-current to said assembly of LEDs.

10. The warning light of claim 9, wherein said means for calculating adjusts the pulse timing of said assembly of LEDs.

11. The warning light of claim 9, wherein said means for calculating adjusts the pulse duration and pulse repetition rate used to excite said assembly of LEDs.

12. The warning light of claim 1, wherein said control circuit is operable to provide separate control signals to separate LED modules.

13. The warning light of claim 1, wherein said control circuit is operable to communicate with other external devices and networks.

14. The warning light of claim 13, wherein said control circuit includes means for receiving commands to alter its operation.

15. The warning light of claim 13, wherein said control circuit includes means for transmitting data from various environmental sensors.

16. The warning light of claim 13, wherein said control circuit includes means for transmitting data about its own status.

17. The warning light of claim 1, wherein said one or more environmental sensors is selected from the group consisting of:
  ambient temperature;
  internal temperature;
  ambient light level;
  emitted light leve;
  relative humidity;
  liquid moisture;
  mechanical tilt;
  vibration;
  physical shock;
  marine wave height and period;
  air pressure;
  solar cell voltage;
  battery voltage;
  supply voltage.

18. The warning light of claim 1, further comprising a temperature sensor electrically coupled to said control circuit, and wherein said control circuit is operable to derate said LEDs with temperature.

19. The warning light of claim 1, further comprising selectively applied light-control-film to direct and focus light, rather than expensive and complex curved or circular circuit assemblies, lenses or reflectors.

20. The warning light of claim 1, wherein said warning light is polygon in cross-section, and includes light-control-film to refract light from said assembly of LEDs omni-directionally.

21. The warning light of claim 1, wherein multi-directional light is provided, said warning light comprising a plurality of LED subassemblies on rigid printed circuits, said rigid printed circuits being connected to one another such that the separate LED sub-assemblies are aimed in different directions.

22. A warning light comprising:
  a plurality of separate LED sub-assemblies on rigid printed circuits, attached to a base circuit board that provides both mechanical and electrical connection between the rigid circuit boards and the base circuit board, said separate LED sub-assemblies being pointed in different directions;
  a control circuit operable to drive said separate LED sub-assemblies;
  one or more environmental sensors coupled to said control circuit;
  said control circuit further including:
    means for receiving data and/or measurements from said environmental sensors;
    means for calculating optimal operating parameters for said separate LED sub-assemblies, based on said environmental data and/or measurements; and
    means for driving said separate LED sub-assemblies in accordance with said calculated optimal operating parameters;
    wherein a multi-directional warning light module is assembled without the need for costly flexible or bendable circuit board materials; and
    wherein said means for driving includes an inductive excitation circuit allowing the device to operate from a wide range of electrical supply voltages.

23. A warning light comprising:
  an assembly of light emitting diodes (LEDs);
  a control circuit operable to drive said LEDs;
  one or more environmental sensors coupled to said control circuit;
  said control circuit further including:
    circuitry for receiving data and/or measurements from said environmental sensors;
    circuitry for calculating optimal operating parameters for said LEDs, based on said environmental data ardor measurements; and
    circuitry for driving said LEDs in accordance with said calculated optimal operating parameters;
    wherein said circuitry for driving includes an inductive excitation circuit allowing the device to operate from a wide range of electrical supply voltages.

* * * * *

UNITED STATES PATENT AND TRADEMARK OFFICE
CERTIFICATE OF CORRECTION

PATENT NO. : 6,980,119 B2
DATED : December 27, 2005
INVENTOR(S) : Toulmin et al.

It is certified that error appears in the above-identified patent and that said Letters Patent is hereby corrected as shown below:

Title page,
Insert Item -- [30] Foreign Application Priority Data
              June 26, 2006    CA     2,391,681 --.
Item [57], ABSTRACT,
Line 2, "light" should be -- lights --.

Column 1,
Line 49, "consumption. It" should be -- consumption, it --.

Column 2,
Line 39, "to he" should be -- to the --.

Column 3,
Line 6, "ILMS" should be -- ILMs --.
Line 61, "overdriven" should be -- over-driven --.

Column 5,
Line 20, "on-stab" should be -- on-state --.
Line 29, "P1" should be -- D1 --.
Line 46, "ON" should be -- DN --.
Line 64, "stiffer" should be -- suffer --.

Column 7,
Line 10, "line" should be -- link --.
Line 31, "it" should be -- It --.
Line 59, "L2." should be -- L2, --.

Column 8,
Line 10, "headers 68" should be -- headers 66 --.

Column 9,
Line 19, "lightbars" should be -- light-bars --.

Column 11,
Line 7, "leve" should be -- level --.

UNITED STATES PATENT AND TRADEMARK OFFICE
CERTIFICATE OF CORRECTION

PATENT NO. : 6,980,119 B2
DATED : December 27, 2005
INVENTOR(S) : Toulmin et al.

It is certified that error appears in the above-identified patent and that said Letters Patent is hereby corrected as shown below:

Column 12,
Line 30, "ardor" should be -- and/or --.

Signed and Sealed this

Sixteenth Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,980,119 B2
APPLICATION NO. : 10/607021
DATED : December 27, 2005
INVENTOR(S) : Toulmin et al.

It is certified that error appears in the above-identified patent and that said Letters Patent is hereby corrected as shown below:

<u>Title page,</u>
Insert Item -- [30] Foreign Application Priority Data
    June 26 CA 2,391,681 --.
Item [57], ABSTRACT,
Line 2, "light" should be -- lights --.

<u>Column 1,</u>
Line 49, "consumption.  It" should be -- consumption, it --.

<u>Column 2,</u>
Line 39, "to he" should be -- to the --.

<u>Column 3,</u>
Line 6, "ILMS" should be -- ILMs --.
Line 61, "overdriven" should be -- over-driven --.

<u>Column 5,</u>
Line 20, "on-stab" should be -- on-state --.
Line 29, "P1" should be -- D1 --.
Line 46, "ON" should be -- DN --.
Line 64, "stiffer" should be -- suffer --.

<u>Column 7,</u>
Line 10, "line" should be -- link --.
Line 31, "it" should be -- It --.
Line 59, "L2." should be -- L2, --.

<u>Column 8,</u>
Line 10, "headers 68" should be -- headers 66 --.

<u>Column 9,</u>
Line 19, "lightbars" should be --light-bars --.

<u>Column 11,</u>
Line 7, "leve" should be -- level --.

UNITED STATES PATENT AND TRADEMARK OFFICE
CERTIFICATE OF CORRECTION

PATENT NO.       : 6,980,119 B2
APPLICATION NO.  : 10/607021
DATED            : December 27, 2005
INVENTOR(S)      : Toulmin et al.

It is certified that error appears in the above-identified patent and that said Letters Patent is hereby corrected as shown below:

Column 12,
Line 30, "ardor" should be -- and/or --.

This certificate supersedes certificate of correction issued May 16, 2006.

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,980,119 B2 |
| APPLICATION NO. | : 10/607021 |
| DATED | : December 27, 2005 |
| INVENTOR(S) | : Toulmin et al. |

It is certified that error appears in the above-identified patent and that said Letters Patent is hereby corrected as shown below:

<u>Title page,</u>
Insert Item -- [30] Foreign Application Priority Data
               June 26, 2002   CA        2,391,681 --.
Item [57], ABSTRACT,
Line 2, "light" should be -- lights --.

<u>Column 1,</u>
Line 49, "consumption.  It" should be -- consumption, it --.

<u>Column 2,</u>
Line 39, "to he" should be -- to the --.

<u>Column 3,</u>
Line 6, "ILMS" should be -- ILMs --.
Line 61, "overdriven" should be -- over-driven --.

<u>Column 5,</u>
Line 20, "on-stab" should be -- on-state --.
Line 29, "P1" should be -- D1 --.
Line 46, "ON" should be -- DN --.
Line 64, "stiffer" should be -- suffer --.

<u>Column 7,</u>
Line 10, "line" should be -- link --.
Line 31, "it" should be -- It --.
Line 59, "L2." should be -- L2, --.

<u>Column 8,</u>
Line 10, "headers 68" should be -- headers 66 --.

<u>Column 9,</u>
Line 19, "lightbars" should be --light-bars --.

<u>Column 11,</u>
Line 7, "leve" should be -- level --.

UNITED STATES PATENT AND TRADEMARK OFFICE
CERTIFICATE OF CORRECTION

PATENT NO. : 6,980,119 B2
APPLICATION NO. : 10/607021
DATED : December 27, 2005
INVENTOR(S) : Toulmin et al.

It is certified that error appears in the above-identified patent and that said Letters Patent is hereby corrected as shown below:

<u>Column 12,</u>
Line 30, "ardor" should be -- and/or --.

This certificate supersedes certificate of correction issued May 16, 2006 and August 29, 2006.

Signed and Sealed this

Sixth Day of March, 2007

JON W. DUDAS
*Director of the United States Patent and Trademark Office*